United States Patent
Saka

(10) Patent No.: US 7,834,393 B2
(45) Date of Patent: Nov. 16, 2010

(54) SEMICONDUCTOR DEVICE AND MANUFACTURING METHOD OF THE SEMICONDUCTOR DEVICE

(75) Inventor: Kikuo Saka, Hyogo (JP)

(73) Assignee: Ricoh Company, Ltd., Tokyo (JP)

( * ) Notice: Subject to any disclaimer, the term of this patent is extended or adjusted under 35 U.S.C. 154(b) by 135 days.

(21) Appl. No.: 11/894,319

(22) Filed: Aug. 20, 2007

(65) Prior Publication Data
US 2008/0048254 A1  Feb. 28, 2008

(30) Foreign Application Priority Data
Aug. 24, 2006 (JP) ............... 2006-227328

(51) Int. Cl.
*H01L 29/94* (2006.01)
(52) U.S. Cl. ............... 257/330; 257/E21.409; 438/270
(58) Field of Classification Search ......... 257/331, 257/339, 344, 383
See application file for complete search history.

(56) References Cited

U.S. PATENT DOCUMENTS 5,143,859 A * 9/1992 Harada ............... 438/137
5,877,058 A * 3/1999 Gardner et al. ......... 438/304
6,262,439 B1 * 7/2001 Takeuchi et al. ......... 257/77

FOREIGN PATENT DOCUMENTS

| JP | 7-50315 | 2/1995 |
|---|---|---|
| JP | 10-173175 | 6/1998 |
| JP | 3699907 | 7/2005 |

* cited by examiner

*Primary Examiner*—Thanh V Pham
*Assistant Examiner*—Mark A Laurenzi, III
(74) *Attorney, Agent, or Firm*—Cooper & Dunham LLP

(57) ABSTRACT

A semiconductor device includes a power MOSFET including a trench formed on a surface of a semiconductor layer forming a drain; a gate electrode formed in the trench via a gate insulation film and made of poly-silicon; a channel diffusion layer formed at a surface side of the semiconductor layer shallower than the trench by neighboring the trench; and a source diffusion layer formed at a surface side of the channel diffusion layer by neighboring the trench; wherein a reverse impurity layer is provided at a bottom part side of the trench of the poly-silicon forming the gate electrode; and an impurity ion that is a conductive type opposite to the conductive type of an impurity ion provided in the poly-silicon at a surface side of the trench is provided in the reverse impurity layer.

13 Claims, 5 Drawing Sheets

SEMICONDUCTOR DEVICE AND MANUFACTURING METHOD OF THE SEMICONDUCTOR DEVICE

BACKGROUND

1. Technical Field

This disclosure generally relates to semiconductor devices and methods for manufacturing the semiconductor devices. More specifically, the disclosure relates to a semiconductor device having a power MOSFET and a method for manufacturing such a semiconductor device. Here, the power MOSFET includes a trench formed on a surface of a semiconductor layer forming a drain, a gate electrode formed in the trench via a gate insulation film, a channel diffusion layer formed at a surface side of the semiconductor layer, shallower than the trench and neighboring the trench, and a source diffusion layer formed at a surface side of the channel diffusion layer and neighboring the trench.

2. Description of the Related Art

Conventionally, a trench gate type power MOSFET (metal oxide semiconductor field effect transistor) is used as a MOSFET for which high speed switching is required such as a MOSFET used for a DC/DC converter or the like. In the power MOSFET, in order to improve the switching properties, it is required to make an on-resistance (resistance between a source electrode and a drain electrode of FET in a state where FET is in on-state) and feedback capacitance (capacitance between a gate and a drain) small.

However, the on-resistance and the feedback capacitance are in conflict with each other. In other words, while it is necessary to make an insulation film of a trench bottom part projecting to a drain electrode thick in order to reduce the feedback capacitance, the on-resistance becomes high if the gate insulation film of a trench side surface is made thick.

In order to solve such a problem, for example, a method whereby the insulation film of the trench bottom part is made thicker than the thickness of the gate insulation film is suggested in Japanese Patent No. 3699907.

In the method whereby only the insulation film of the trench bottom part is made thick, a silicon oxide film is used as the insulation film and a silicon nitride film as an oxidation resistance film is formed on the trench side surface at the time of thermal oxidation. As a result of this, oxidation of the trench side surface is prevented and only the trench bottom part is oxidized.

In addition, a method is suggested wherein neutral particle such as argon are implanted with high concentration so that silicon crystal of the trench bottom part is made amorphous and the trench bottom part is promoted.

Furthermore, as another method for solving the above-discussed problem, for example, Japanese Laid-Open Patent Application Publication No. 10-173175 suggests a method wherein an impurity ion concentration at the trench bottom side of gate poly-silicon embedded in the trench is decreased or poly-silicon not containing impurity ions is embedded in the trench bottom part so that a capacitor is formed inside the gate poly-silicon and the feedback capacitance is reduced.

SUMMARY

In an aspect of this disclosure, there are provided a semiconductor device having a trench-type power MOSFET and a method for manufacturing the semiconductor device, whereby feedback capacitance between a gate and a drain of the trench-type power MOSFET can be reduced in a simple way without increasing the gate insulation film thickness.

In another aspect of this disclosure, there is provided a semiconductor device including a power MOSFET including a trench formed on a surface of a semiconductor layer forming a drain; a gate electrode formed in the trench via a gate insulation film and made of poly-silicon; a channel diffusion layer formed at a surface side of the semiconductor layer shallower than the trench by neighboring the trench; and a source diffusion layer formed at a surface side of the channel diffusion layer by neighboring the trench; wherein a reverse impurity layer is provided at a bottom part side of the trench of the poly-silicon forming the gate electrode; and an impurity ion that is a conductive type opposite to the conductive type of an impurity ion provided in the poly-silicon at a surface side of the trench is provided in the reverse impurity layer.

One aspect of the present invention may be to provide a semiconductor device, including a power MOSFET including a trench formed on a surface of a semiconductor layer forming a drain; a gate electrode formed in the trench via a gate insulation film and made of poly-silicon; a channel diffusion layer formed at a surface side of the semiconductor layer shallower than the trench by neighboring the trench; and a source diffusion layer formed at a surface side of the channel diffusion layer by neighboring the trench; wherein a reverse impurity layer is provided at a bottom part side of the trench of the poly-silicon forming the gate electrode; and an impurity ion that is a conductive type opposite to the conductive type of an impurity ion provided in the poly-silicon at a surface side of the trench is provided in the reverse impurity layer.

The impurity ion forming the reverse impurity layer may not be provided in the poly-silicon of the gate electrode neighboring the gate insulation film of a side surface of the trench.

The impurity ion provided in the reverse impurity layer may be a $B^+$ ion or a $BF_2^+$ ion.

The impurity ion provided in the reverse impurity layer are not limited to $B^+$ ion or $BF_2^+$ ions but may be $P^-$ ions (phosphorus ions) or $As^-$ ion (arsenic ions).

Another aspect of the present invention may be to provide a manufacturing method of a semiconductor device, the semiconductor device including a power MOSFET, the power MOSFET including a trench formed on a surface of a semiconductor layer forming a drain; a gate electrode formed in the trench via a gate insulation film and made of poly-silicon; a channel diffusion layer formed at a surface side of the semiconductor layer shallower than the trench and neighboring the trench; and a source diffusion layer formed at a surface side of the channel diffusion layer and neighboring the trench, the manufacturing method of a semiconductor device including: a first step of forming a first poly-silicon film in the trench, the trench having an inside wall where the gate insulation film is formed, at a film thickness so that the trench is not covered; a second step of implanting an impurity ion for a reverse impurity layer in the first poly-silicon film; a third step of forming a second poly-silicon film on the first poly-silicon film at film thickness so that the trench is covered; and a fourth step of providing an impurity ion that is a conductive type opposite to the conductive type of the impurity ion for the reverse impurity layer, in the first poly-silicon film and the second poly-silicon film, such that the impurity ion for the reverse impurity layer implanted in the first poly-silicon film of the bottom part of the trench is not cancelled.

The implantation angle of the implantation of the impurity ion for the reverse impurity layer may be zero (0) degrees.

The implantation angle of the above-mentioned ion implantation is not limited to zero (0) degrees.

The manufacturing method of the semiconductor device may further include a step of using a B$^+$ ion as the impurity ion for the reverse impurity layer and forming a silicon oxide film on the first poly-silicon surface before the B$^+$ ion is implanted.

The manufacturing method of the semiconductor device may further include a step of using a BF$_2^+$ ion as the impurity ion for the reverse impurity layer and forming a silicon oxide film on the first poly-silicon surface before the BF$_2^+$ ion is implanted.

Other aspects, features, and advantages will be come more apparent from the following detailed description when read in conjunction with the accompanying drawings.

DETAILED DESCRIPTION OF THE PREFERRED EMBODIMENTS

A description of exemplary embodiments and examples is provided below, with reference to the FIG. 1 through FIG. 9.

Figure 1:
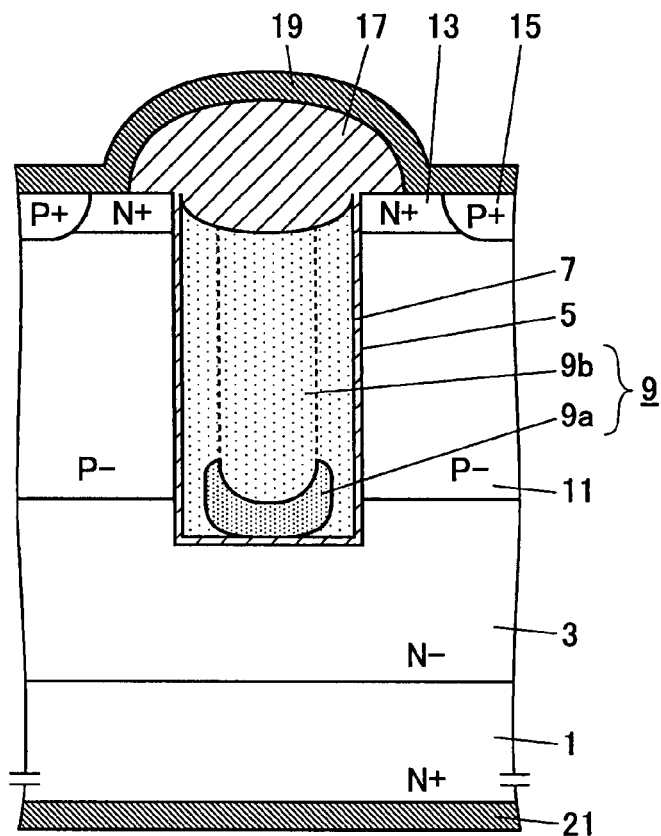
FIG. 1 is a cross-sectional view of a single trench part of a semiconductor device of an embodiment of the present invention.
Figure 2:
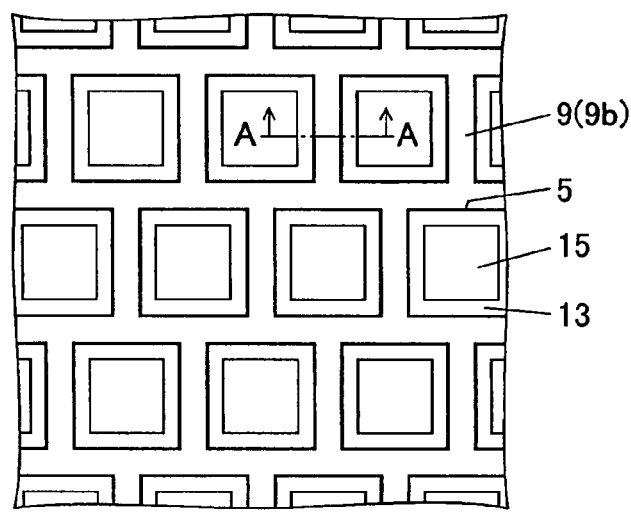
FIG. 2 is a plan view showing plural trench parts of the semiconductor device of the embodiment of the present invention.

FIG. 1 is a cross-sectional view of a single trench part of a semiconductor device of an embodiment of the present invention. FIG. 2 is a plan view showing plural trench parts of the semiconductor device of the embodiment of the present invention. More specifically, FIG. 1 is a cross-sectional view taken along a line A-A of FIG. 2.

As shown in FIG. 1, an N-type epitaxial layer (N−) 3 formed by epitaxial growth is provided on a surface of an N-type single crystal silicon substrate (N+) 1. The thickness of the N-type epitaxial layer (N−) 3 is, for example, approximately 5.0 μm. The N-type single crystal silicon substrate (N+) 1 and the N-type epitaxial layer (N−) 3 form a drain.

A trench 5 is formed in a surface of the N-type epitaxial layer (N−) 3, the surface being situated at a side opposite to the N-type single crystal silicon substrate (N+) 1. As shown in FIG. 2, the trenches 5 are provided so as to separate the N-type epitaxial layer (N−) 3 into islands in a zigzag pattern. Each trench has a width of approximately 0.8 μm and depth of approximately 1.5 μm.

As shown in FIG. 1, a gate insulation film 7 (not shown in FIG. 2) made of silicon oxide film is formed on an internal wall of the trench 5. The thickness of the silicon oxide film forming the gate insulation film 7 is, for example, approximately 30 nm.

A gate electrode 9 is formed in the trench 5 via the gate insulation film 7. The gate electrode 9 is made of poly-silicon and a P-type impurity layer (reverse impurity layer) 9a and an N-type impurity layer 9b.

The P-type impurity layer (reverse impurity layer) 9a is formed at a bottom part of the trench 5 with a gap between it and the gate insulation film 7 of the side surface of the trench 5. The N-type impurity layer 9b is formed in an area other than the area of the P-type impurity layer (reverse impurity layer) 9a, namely at a surface side of the trench 5 and in an area neighboring the gate insulation film 7 of the side surface of the trench 5.

More specifically, P-type impurity ions are not provided in the N-type impurity layer 9b neighboring the gate insulation film 7 of the side surface of the trench 5. In addition, the N-type impurity ion concentration of the N-type impurity layer 9b becomes lower as it approaches to the bottom part side of the trench 5.

A P-type channel diffusion layer (P−) 11 is formed at a surface side of the N-type epitaxial layer (N−) 3 so as to neighbor the trench 5. The P-type channel diffusion layer (P−) 11 is formed so as to be shallower than the trench 5 and has a depth of, for example, approximately 1.1 μm.

An N-type source diffusion layer 13 is formed at a surface side of the P-type channel diffusion layer (P−) 11 so as to neighbor the trench 5.

A P-type contact diffusion layer (P+) 15 is formed at the surface side of the P-type channel diffusion layer (P−) 11 with a designated gap between it and the trench 5. The P-type contact diffusion layer (P+) 15 is used for providing electric potential to the P-type channel diffusion layer (P−) 11 and has a P-type impurity ion concentration higher than that of the P-type channel diffusion layer (P−) 11.

An interlayer insulation film 17 made of, for example, silicon oxide, is formed on the gate electrode 9. The interlayer insulation film 17 covers a part of the source diffusion layer 13 neighboring the trench 5.

A source electrode 19 is formed on the source diffusion layer 13, the P-type contact diffusion layer (P+) 15, and the interlayer insulation film 17. The source electrode 19 is made of a metal film such as aluminum (Al).

A drain electrode 21 is formed on a surface of the N-type single crystal silicon substrate (N+) 1 opposite to the N-type epitaxial layer (N−) 3. The drain electrode 21 is made of a metal film such as silver (Ag).

In this embodiment, the P-type impurity layer (reverse impurity layer) 9a is provided at the bottom part side of the trench 5 of poly-silicon forming the gate electrode 9. P-type impurity ions that are an opposite conductive type against the N-type impurity ions provided in the N-type impurity layer 9b at the surface side of the trench 5 is provided in the P-type impurity layer (reverse impurity layer) 9a.

Because of this, without making the gate insulation film 7 thick, it is possible to reduce the feedback capacitance between the gate and the drain of the trench type power MOSFET. In addition, since there is no need to make the gate insulation film 7 thick, increase of the on-resistance (resistance between a source electrode and a drain electrode of FET in a state where FET is in on-state) can be prevented.

Furthermore, a part of the gate electrode 9 neighboring the gate insulation film 7 formed at the side surface part of the trench 5 coming in contact with the N-type epitaxial layer (N−) 3 is the N-type impurity layer 9b. Accordingly, the cumulative effect of a large number of carriers can be increased so that the on-resistance can be decreased.

FIG. 3 through FIG. 8 are cross-sectional views for explaining steps of a manufacturing method of the semiconductor device shown in FIG. 1 and FIG. 2. An example of the manufacturing method of the semiconductor device is discussed with reference to FIG. 1 and FIG. 3 through FIG. 8.

Figure 3:
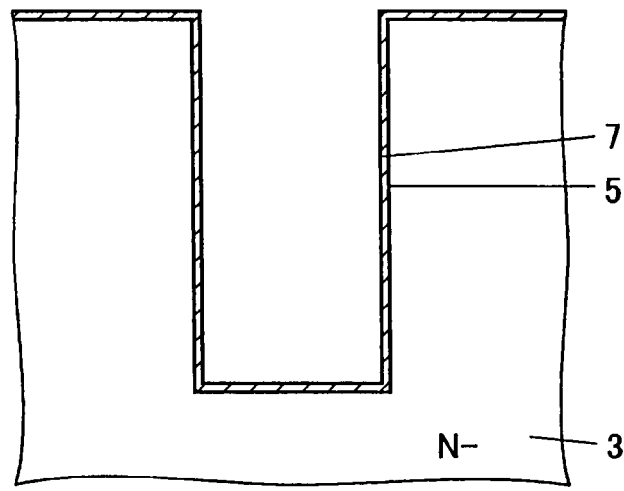
FIG. 3 is a cross-sectional view for explaining a first step of a manufacturing method of the semiconductor device of the embodiment of the present invention.

(1) The trench 5 is formed in the N-type epitaxial layer (N−) 3 formed on the N-type single crystal silicon substrate (N+) 1 by a photomechanical technique and an etching technique. In addition, as shown in FIG. 3, the gate insulation film 7 made of silicon oxide is formed on the N-type epitaxial layer (N−) 3 including an inside wall of the trench 5.

(2) The non-dope first poly-silicon film 23 is formed, by, for example, a CVD (Chemical Vapor Deposition) method, on the gate insulation film 7 including the inside wall of the trench 5 at film thickness, such that the trench 5 is not covered.

Figure 4:
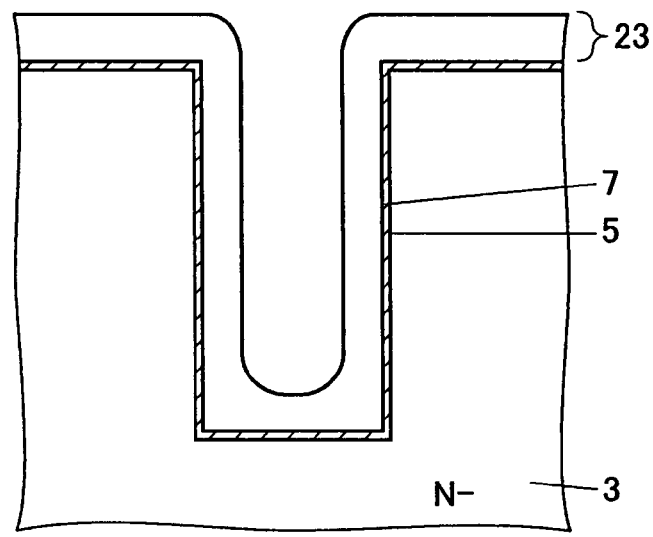
FIG. 4 is a cross-sectional view for explaining a second step of the manufacturing method of the semiconductor device of the embodiment of the present invention.

In this example, as shown in FIG. 4, the first poly-silicon film 23 having film thickness of approximately 250 nm is formed in the trench 5 having width of approximately 0.8 μm.

While non-doped poly-silicon is used as the first poly-silicon film 23 in this example, the first poly-silicon film 23 may be doped poly-silicon containing P-type impurity ions or N-type impurity ions.

Since it is preferable, in this example, that the P-type impurity ions are not included in the first poly-silicon film 23 neighboring the gate insulation film 7 at the side surface of the trench 5, it is preferable to use non-doped poly-silicon or the poly-silicon containing N-type impurity ions as the first poly-silicon film 23.

(3) The silicon oxide film 25 having film thickness of, for example, approximately 25 nm is formed on the surface of the first poly-silicon film 23. By using an ion implantation technique, the P-type impurity ions 27 (boron ion (B$^+$) in this example) are implanted in the first poly-silicon film 23 via the silicon oxide film 25 under conditions where, for example, the implantation angle is 0 (zero) degrees, a dose amount is $1.0 \times 10^{14}$ through $1.0 \times 10^{15}$ atoms/cm$^2$, and implantation energy is 20 keV.

Figure 5:
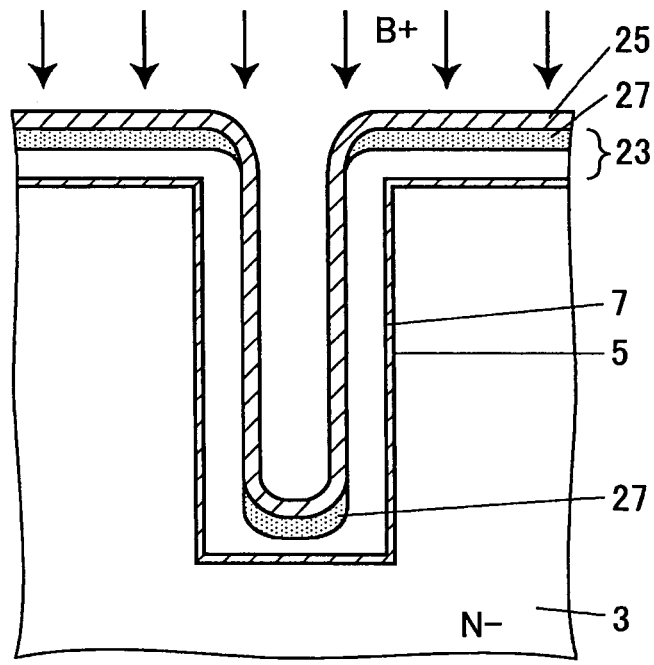
FIG. 5 is a cross-sectional view for explaining a third step of the manufacturing method of the semiconductor device of the embodiment of the present invention.

Here, since the boron ions (B$^+$) are implanted in the first poly-silicon film 23 at the implantation angle of 0 (zero) degree, the boron ions (B$^+$) are not implanted in the first poly-silicon film 23 neighboring the side surface of the trench 5, as shown in FIG. 5.

In this example, since the silicon oxide film 25 is formed on the surface of the first poly-silicon film 23 before implantation of the boron ions (B$^+$) and the boron ions (B$^+$) are implanted via the silicon oxide film 25, it is possible to prevent channeling of the boron ion (B$^+$) and prevent the boron ions (B$^+$) from appearing at the N-type epitaxial layer (N−) 3 via the gate insulation film 7 of the bottom part of the trench 5. Here, channeling means a phenomenon where ion seeds are implanted deep in the silicon crystal substrate 1.

In a case where the appearance of the boron ions (B$^+$) at the N-type epitaxial layer (N−) 3 is not a concern even if there is no silicon oxide film 25, it is not necessary to form the silicon oxide film 25.

While the boron ions (B$^+$) are implanted in the first poly-silicon film 23 at the implantation angle of 0 (zero) degree in this example, the boron ion (B$^+$) may be implanted by an oblique ion implantation method. In this case, the boron ions (B$^+$) are implanted in the first poly-silicon film 23 neighboring the side surface of the trench 5, too. It is preferable that the concentration of the boron ions (B$^+$) do not affect the decrease of the on-resistance of the MOSFET.

Figure 6:
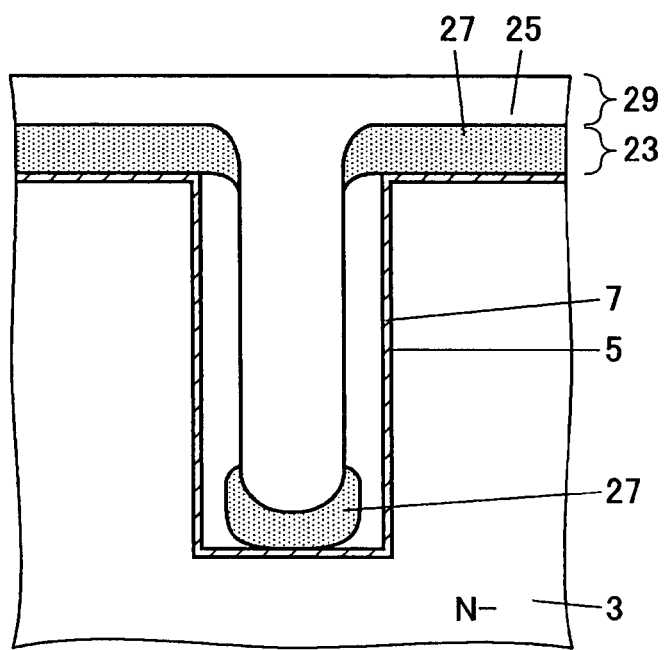
FIG. 6 is a cross-sectional view for explaining a fourth step of the manufacturing method of the semiconductor device of the embodiment of the present invention.

(4) After the boron ion (B$^+$) implanted in the step (3) are activated, the silicon oxide film 25 is removed. For example, as shown in FIG. 6, by the CVD (Chemical Vapor Deposition) method, the non-dope second poly-silicon film 29 is formed on the first poly-silicon film 23 including the inside wall of the trench 5 at film thickness so that the trench 5 is covered.

Here, it is preferable that the film thickness of the second poly-silicon film 29 be such that the surface of the second poly-silicon film 29 is plane. In addition, activation of the boron ion (B$^+$) implanted in step (3) may be implemented simultaneously with diffusion of phosphorus ion of a next step.

Furthermore, while the non-doped poly-silicon is formed as the second poly-silicon film 29 in this example, the second poly-silicon film 29 may be doped poly-silicon containing P-type impurity ions which do not affect the decrease of the on-resistance at the time of completion of the trench type power MOSFET. The second poly-silicon film 29 may also be doped poly-silicon containing N-type impurity ions which do not cause cancellation of the boron ion (B$^+$) implanted in the bottom part of the trench 5 at the time when the trench type power MOSFET is completed.

(5) Phosphorus (not shown) is stacked on the second poly-silicon film 29 and a thermal diffusion process is applied so that phosphorus ions are provided in the first poly-silicon film 23 and the second poly-silicon film 29. The phosphorus ions are provided from a surface of the second poly-silicon film 29. The concentration of the phosphorus ions is higher as the bottom part side of the trench 5 is approached.

The boron ions (B$^+$) implanted in the first. poly-silicon film 23 outside the trench 5 are returned to an N-type by providing the phosphorus ions. The boron ions (B$^+$) implanted in the first poly-silicon film 23 of the bottom part of the trench 5 are not cancelled and remain because concentration of the phosphorus ions provided in this part is low.

Figure 7:
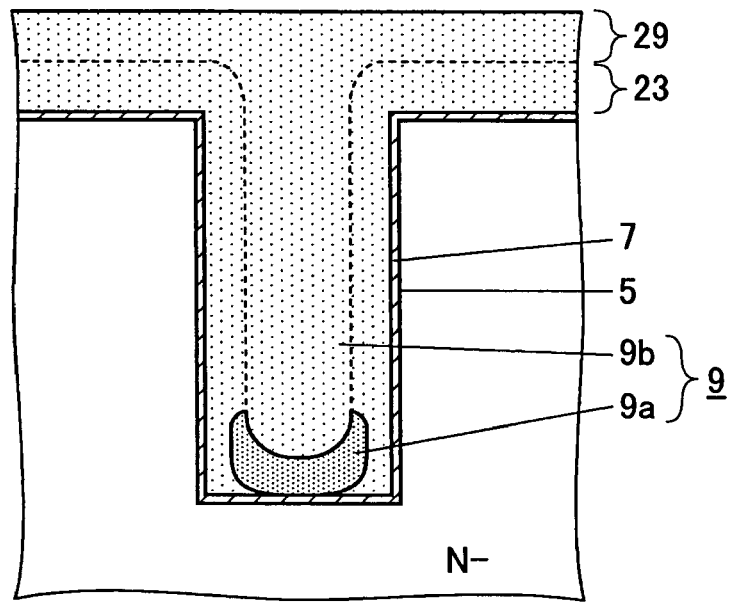
FIG. 7 is a cross-sectional view for explaining a fifth step of the manufacturing method of the semiconductor device of the embodiment of the present invention.
Figure 8:
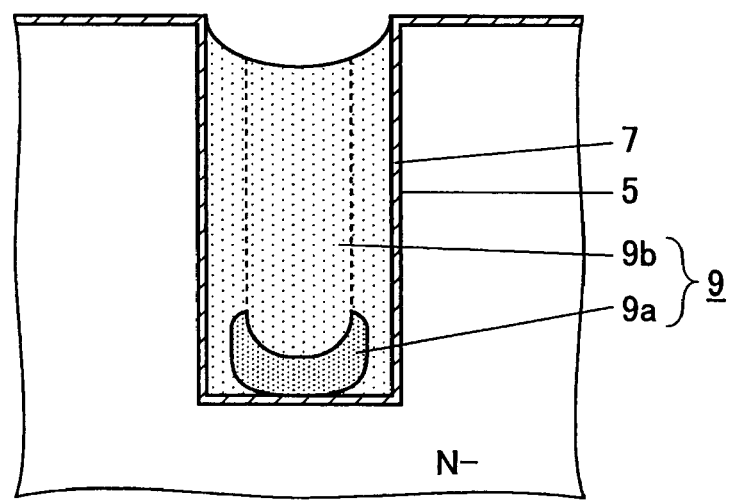
FIG. 8 is a cross-sectional view for explaining a sixth step of the manufacturing method of the semiconductor device of the embodiment of the present invention.

As a result of this, the gate electrode 9 having the P-type impurity layer (reverse impurity layer) 9a and the N-type impurity layer 9b is formed as shown in FIG. 7.

More specifically, the P-type impurity layer (reverse impurity layer) 9a is formed at the bottom part of the trench 5 with a gap between it and the gate insulation film 7 of the side surface of the trench 5. The N-type impurity layer 9b is formed in an area other than the P-type impurity layer (reverse impurity layer) 9a, namely at the surface side of the trench 5 and in the area neighboring the gate insulation film 7 of the side surface of the trench 5.

Even if the P-type impurity layer remains in the first poly-silicon film 23 outside the trench 5, this first poly-silicon film 23 is removed in the next step.

(6) The first poly-silicon film 23 and the second poly-silicon film 29 outside the trench 5 are removed by an etching process as shown in FIG. 7.

(7) By using a normal manufacturing step of the trench type power MOSFET, the P-type channel diffusion layer (P−) 11, the source diffusion layer 13, and the P-type contact diffusion layer (P+) 15 are formed on the N-type epitaxial layer (N−) 3. In addition, the interlayer insulation film 17, the source electrode 19, and the drain electrode 21 are formed so that the trench type power MOSFET is completed as shown in FIG. 1.

Thus, according to the example of the manufacturing method of the semiconductor device, it is possible to manufacture the semiconductor device shown in FIG. 1. The P-type channel diffusion layer (P−) 11, the source diffusion layer 13, and the P-type contact diffusion layer (P+) 15 may be formed before the trench 5 is formed.

Figure 9:
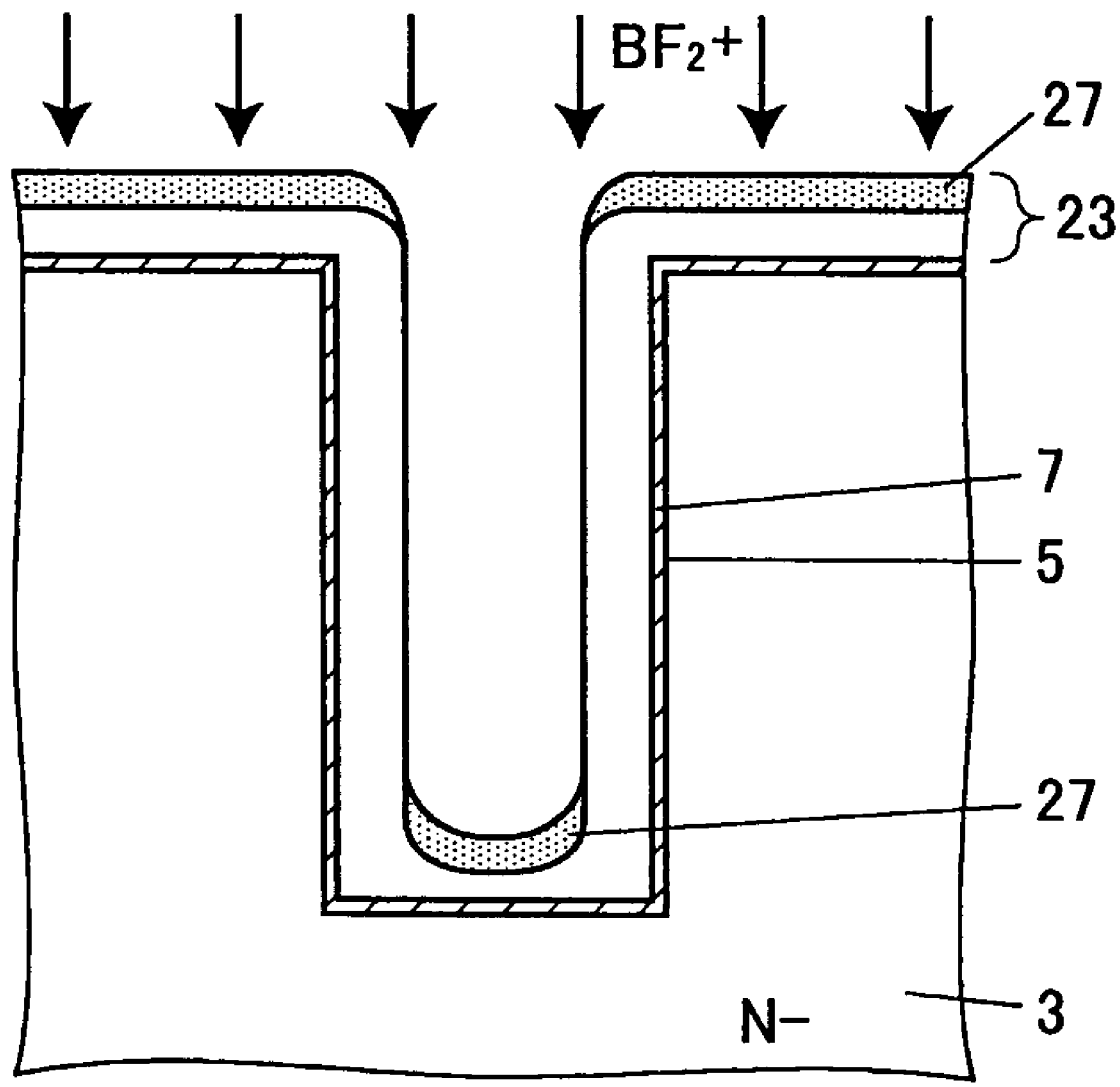
FIG. 9 is a cross-sectional view for explaining a part of a manufacturing method of the semiconductor device of another embodiment of the present invention.

FIG. 9 is a cross-sectional view for explaining a part of a manufacturing method of the semiconductor device of another embodiment of the present invention. Steps of the manufacturing method of the semiconductor device of the other embodiment of the present invention are the same as the steps of the manufacturing method discussed with reference to FIG. 1 and FIG. 3 through FIG. 8 except the step (3).

In the above-discussed example, as discussed at the step (3) with reference to FIG. 5, the boron ions ($B^+$) are used as an ion implantation seed for forming the P-type impurity layer (reverse impurity layer) 9a of the gate electrode 9.

In an example shown in FIG. 9, the $BF_2^+$ ions are used as an ion implantation seed for forming the P-type impurity layer (reverse impurity layer) 9a of the gate electrode 9. Furthermore, a step of forming the silicon oxide film 25 shown in FIG. 5 before $BF_2^+$ ions are implanted is not provided. Conditions for implanting $BF_2^+$ ion are that, for example, an implantation angle is 0 (zero) degrees, a dose amount is $1.0 \times 10^{14}$ through $1.0 \times 10^{15}$ atoms/cm$^2$, and implantation energy is 40 keV.

An ion radius of the $BF_2^+$ ions is larger than an ion radius of the $B^+$ ions. Therefore, the probability that channeling happens is low even if the silicon oxide film is not formed before the $BF_2^+$ ions are implanted. Accordingly, there is no need to form the silicon oxide film 25 shown in FIG. 5.

In addition, in a case where the $BF_2^+$ ions are used compared to a case where the boron ions ($B^+$) are used, a providing margin to the semiconductor layer can be made large.

Since a natural oxidization film is formed on a surface of the first poly-silicon film 23, a step is required for removing the natural oxidization formed on the surface of the first poly-silicon film 23 before the second poly-silicon film 29 is formed is required.

According to the embodiments of the present invention, it is possible to provide a semiconductor device, including a power MOSFET including a trench formed on a surface of a semiconductor layer forming a drain; a gate electrode formed in the trench via a gate insulation film and made of poly-silicon; a channel diffusion layer formed at a surface side of the semiconductor layer shallower than the trench by neighboring the trench; and a source diffusion layer formed at a surface side of the channel diffusion layer by neighboring the trench; wherein a reverse impurity layer is provided at a bottom part side of the trench of the poly-silicon forming the gate electrode; and an impurity ion that is a conductive type opposite to the conductive type of an impurity ion provided in the poly-silicon at a surface side of the trench is provided in the reverse impurity layer.

According to above-mentioned semiconductor device, it is possible to reduce the feedback capacitance between the gate and the drain of the trench type power POSFET without making the gate insulation film thick, by a simple method. Since there is no need to make the gate insulation film thick, an increase of the on-resistance can be prevented.

The impurity ion forming the reverse impurity layer may not be provided in the poly-silicon of the gate electrode neighboring the gate insulation film of a side surface of the trench.

According to above-mentioned semiconductor device, compared to a case where the impurity ion for forming the reverse impurity layer are provided in the gate electrode poly-silicon neighboring the gate insulation film of the trench side surface, it is possible to increase the cumulative effect of the large number of the carriers at the drain part under the channel diffusion layer neighboring the gate insulation film so that the on-resistance can be decreased.

The impurity ion provided in the reverse impurity layer may be a $B^+$ ion or a $BF_2^+$ ion.

Since the impurity ion provided in the reverse impurity layer are $B^+$ ions or $BF_2^+$ ions, it is possible to apply them to the trench type power MOSFET having the N-type poly-silicon electrode. In a case where impurity ion provided in the reverse impurity layer are $P^-$ ions or $As^-$ ions, it is possible to apply them to the trench type power MOSFET having the P-type poly-silicon electrode. It is normal practice to apply the N-type poly-silicon electrode to the N channel MOSFET and to apply the P-type poly-silicon electrode to the P channel MOSFET.

According to the above-discussed embodiments, it is also possible to provide a manufacturing method of a semiconductor device, the semiconductor device including a power MOSFET, the power MOSFET including a trench formed on a surface of a semiconductor layer forming a drain; a gate electrode formed in the trench via a gate insulation film and made of poly-silicon; a channel diffusion layer formed at a surface side of the semiconductor layer shallower than the trench and neighboring the trench; and a source diffusion layer formed at a surface side of the channel diffusion layer and neighboring the trench, the manufacturing method of a semiconductor device including: a first step of forming a first poly-silicon film in the trench, the trench having an inside wall where the gate insulation film is formed, at a film thickness so that the trench is not covered; a second step of implanting an impurity ion for a reverse impurity layer in the first poly-silicon film; a third step of forming a second poly-silicon film on the first poly-silicon film at film thickness so that the trench is covered; and a fourth step of providing an impurity ion that is a conductive type opposite to the conductive type of the impurity ion for the reverse impurity layer, in the first poly-silicon film and the second poly-silicon film, such that the impurity ion for the reverse impurity layer implanted in the first poly-silicon film of the bottom part of the trench is not cancelled.

It is possible to form a gate electrode structure where the reverse impurity layer is provided at the trench bottom part, more specifically where the impurity ions that are the conductive type opposite to the impurity ions provided in the second poly-silicon film at the trench surface side forming a part of the electrode are provided in the first poly-silicon film at the trench surface side forming a part of the electrode.

Accordingly, it is possible to reduce the feedback capacitance between the gate and the drain of the trench type power POSFET without making the gate insulation film thick, by a simple method.

The implantation angle of the implantation of the impurity ion for the reverse impurity layer may be zero (0) degrees.

It is possible to prevent the impurity ions for the reverse impurity layer from being implanted in the first poly-silicon film formed on the trench side surface. Compared to a case where the impurity ions for the reverse impurity layer are provided at the gate electrode poly-silicon part neighboring the gate insulation film, it is possible to increase the cumulative effect of the large number of the carriers at the gate electrode poly-silicon part neighboring the gate insulation film so that the on-resistance can be decreased.

The manufacturing method of the semiconductor device may further include a step of using a $B^+$ ion as the impurity ion for the reverse impurity layer and forming a silicon oxide film on the first poly-silicon surface before the $B^+$ ion is implanted.

The $B^+$ ions are implanted via the silicon oxide film. Even if the $B^+$ ions having small radius are used, channeling can be prevented. It is also possible to prevent the $B^+$ ion from appearing to the drain semiconductor layer via the gate insulation film of the trench bottom part.

The manufacturing method of the semiconductor device may further include a step of using a $BF_2^+$ ion as the impurity ion for the reverse impurity layer and forming a silicon oxide film on the first poly-silicon surface before the $BF_2^+$ ion is implanted.

The probability of generation of channeling of the $BF_2^+$ ions having an ion radius larger than that of the $B^+$ ions is low even if the silicon oxide film is not formed before implantation of the $BF_2^+$ ions. Accordingly, compared to a case where the $B^+$ ions are used as the impurity ions for the reverse impurity layer, it is possible to omit a step of forming the silicon oxide film. In addition, compared to a case where the $B^+$ ions are used as the impurity ions for the reverse impurity layer, a providing margin to the semiconductor layer can be made large.

Although the invention has been described with respect to a specific embodiment for a complete and clear disclosure, the appended claims are not to be thus limited but are to be construed as embodying all modifications and alternative constructions that may occur to one skilled in the art that fairly fall within the basic teaching herein set forth.

For example, in the above-discussed embodiments of the present invention, the present invention is applied to the trench type power MOSFET having the N-type poly-silicon gate electrode where the impurity layer at the trench bottom part side of the poly-silicon forming the gate electrode is formed by the P-type impurity layer and another part is formed by the N-type impurity layer. However, the present invention is not limited to this.

The present invention may be applied to a trench type power MOSFET having the P-type poly-silicon gate electrode where the impurity layer at the trench bottom part side of the poly-silicon forming the gate electrode is formed by the N-type impurity layer and another part is formed by the P-type impurity layer.

In order to form the N-type impurity layer as the reverse impurity layer for the purpose of forming the P-type poly-silicon gate electrode, the $P^{-\ ions\ or\ As^-}$ ions are implanted. In this case, as well as the $BF_2^+$ ions discussed with reference to FIG. 9, the probability of generation of channeling of the $P^-$ ions or $As^-$ ions having a ion radius larger than that of the $B^+$ ions is low even if the silicon oxide film is not formed before implantation of the $P^-$ ions or $As^-$ ions. Accordingly, there is no need to form the silicon oxide film (see FIG. 5). In addition, compared to a case where the $B^+$ ions are used, a providing margin to the semiconductor layer can be made large.

In addition, in the above-discussed examples, the present invention is applied to the N-channel type trench type power MOSFET. However, the present invention is not limited to this but may be applied to the P-channel type trench type power MOSFET.

Furthermore, the gate insulation film is not limited to the silicon oxide film. The gate insulation film may be made of other insulation material such as a film made by stacking the silicon oxide film and a silicon nitride film.

This patent application is based on Japanese Priority Patent Application No. 2006-227328 filed on Aug. 24, 2006, the entire contents of which are hereby incorporated by reference.

What is claimed is:

1. A semiconductor device, comprising:
   a power MOSFET including
      a trench formed on a surface of a semiconductor layer forming a drain;
      a gate electrode formed in the trench via a gate insulation film and made of poly-silicon;
      a channel diffusion layer formed at a surface side of the semiconductor layer, shallower than the trench and neighboring the trench; and
      a source diffusion layer formed at a surface side of the channel diffusion layer, and neighboring the trench;
   wherein a reverse impurity layer is provided on a bottom part side of the trench in the poly-silicon forming the gate electrode, with a gap between the reverse impurity layer and the gate insulation film of an inside side surface of the trench; and
   an impurity ion that is a conductive type opposite to the conductive type of an impurity ion provided in the poly-silicon forming the gate electrode at a surface side of the trench is provided in the reverse impurity layer.

2. The semiconductor device as claimed in claim 1, wherein the impurity ion forming the reverse impurity layer is not provided in the poly-silicon of the gate electrode neighboring the gate insulation film of a side surface of the trench.

3. The semiconductor device as claimed in claim 1, wherein the impurity ion provided in the reverse impurity layer is a $B^+$ ion or a $BF_2^+$ ion.

4. The semiconductor device as claimed in claim 2, wherein the impurity ion provided in the reverse impurity layer is a $B^+$ ion or a $BF_2^+$ ion.

5. The semiconductor device as claimed in claim 1, wherein the gate insulation film is formed on an internal wall of the trench.

6. The semiconductor device as claimed in claim 1, wherein a concentration of the impurity ion provided in the poly-silicon at the surface side of the trench becomes lower at the bottom part side of the trench.

7. The semiconductor device as claimed in claim 1, further comprising:
   a contact diffusion layer formed at the surface side of the channel diffusion layer and separated from the trench by the source diffusion layer.

8. The semiconductor device as claimed in claim 7, further comprising:
   an interlayer insulation film formed on the gate electrode; and
   a source electrode formed on the source diffusion layer, the contact diffusion layer and the interlayer insulation film.

9. The semiconductor device as claimed in claim 8, wherein the interlayer insulation film covers a part of the source diffusion layer neighboring the trench.

10. The device of claim 1, wherein a drain electrode is formed on the silicon substrate, and the gap causes a feedback capacitance between the gate electrode and the drain electrode to be below a predetermined capacitance threshold.

11. The device of claim 10, wherein a source electrode is formed on the source diffusion layer, and the gap causes an on-resistance between the source electrode and the drain electrode to be below a predetermined resistance threshold.

12. The device of claim 11, wherein the drain region is formed with a large number of carriers which cumulatively cause a source-drain-on-resistance of the device to be below a predetermined threshold.

13. A semiconductor device, comprising:
   a power MOSFET including
      a trench formed on a surface of a semiconductor layer, the semiconductor layer forming a drain;
      a gate electrode made of poly-silicon formed in the trench via a gate insulation film;
      a channel diffusion layer formed at a surface side of the semiconductor layer, shallower than the trench and neighboring the trench; and
      a source diffusion layer formed at a surface side of the channel diffusion layer, and neighboring the trench;

a reverse impurity layer provided on a bottom part side of the trench in the poly-silicon forming the gate electrode, where the reverse impurity layer is provided with a plurality of impurity ions of a first conductive type;

a gap between the reverse impurity layer and the gate insulation film of an inside surface of the trench; and a plurality of impurity ions having a second conductive type provided in the poly-silicon forming the gate electrode at all remaining portions of the trench not occupied by the reverse impurity layer;

wherein the second conductive type is opposite to the first conductive type.

* * * * *